United States Patent [19]

Teymouri

[11] Patent Number: 4,672,242
[45] Date of Patent: Jun. 9, 1987

[54] REDUCED POWER/TEMPERATURE CONTROLLED TTL TRI-STATE BUFFER UTILIZING THREE PHASE SPLITTER TRANSISTORS

[75] Inventor: Sasan Teymouri, Mountain View, Calif.

[73] Assignee: Advanced Micro Devices, Inc., Sunnyvale, Calif.

[21] Appl. No.: 836,786

[22] Filed: Mar. 6, 1986

[51] Int. Cl.[4] .................. H03K 19/00; H03K 19/003; H03K 19/088; H03K 19/20
[52] U.S. Cl. .................................... 307/473; 307/443; 307/456; 307/254
[58] Field of Search .................. 307/473, 299 A, 446, 307/456, 457, 458, 270, 254, 443, 454

[56] References Cited
U.S. PATENT DOCUMENTS 3,560,761  2/1971  Kardash .................. 307/456
4,194,132  3/1980  Mrazek ................... 307/473
4,287,433  9/1981  Goodspeed ............... 307/456
4,321,490  3/1982  Bechdolt ................. 307/458
4,430,585  2/1984  Kirk, Jr. ................ 307/456

FOREIGN PATENT DOCUMENTS 0169782  1/1986  European Pat. Off. ...... 307/270
0062235  4/1985  Japan .................... 307/454

Primary Examiner—Stanley D. Miller
Assistant Examiner—Trong Quang Phan
Attorney, Agent, or Firm—Patrick T. King; Davis Chin; J. Vincent Tortolano

[57] ABSTRACT

A tri-level buffer circuit includes three phase splitter bipolar transistors. The buffer circuit consumes less power in the tri-state mode than in the low logic state by reducing the amount of current drawn through the tri-state control line. The buffer circuit incorporates a temperature-controlled current source which supplies a greater amount of current at a low temperature and supplies a smaller amount of current at a high temperature.

20 Claims, 1 Drawing Figure

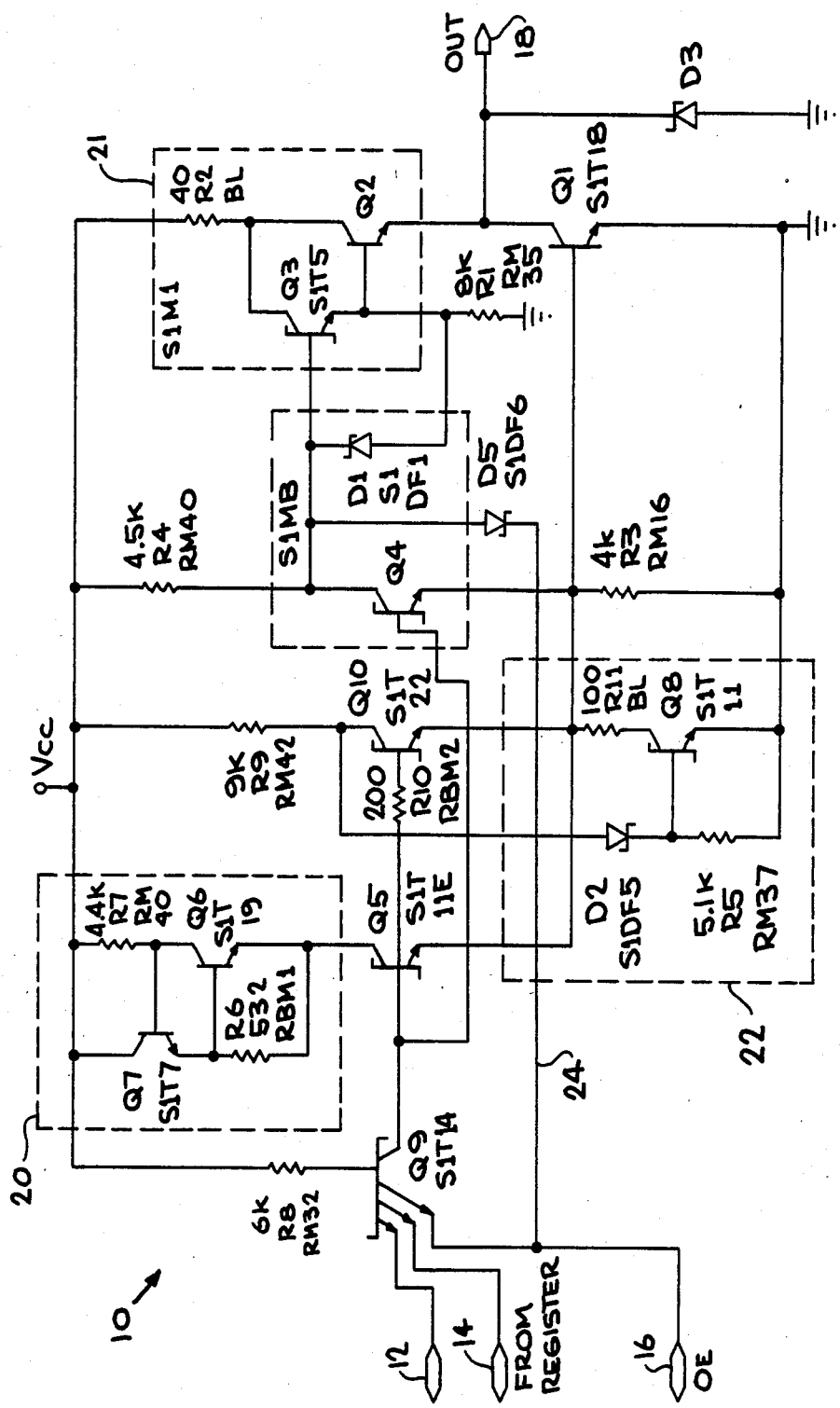

REDUCED POWER/TEMPERATURE CONTROLLED TTL TRI-STATE BUFFER UTILIZING THREE PHASE SPLITTER TRANSISTORS

BACKGROUND OF THE INVENTION

This invention relates generally to transistor-transistor logic (TTL) circuits and more particularly, it relates to a TTL tri-level buffer which consumes less power in the tri-state mode than in the low logic state.

Typically, digital tri-level buffer circuits respond to an input signal either by coupling an output terminal to a supply voltage via an active pull-up device when the input signal is in a first logic state or be coupling the output terminal to a ground potential via a pull-down device when the input signal is in a second logic state. Further, tri-level buffer circuits are responsive to a tri-state control signal which disables both the active pull-up and pull-down devices when the control signal is active so as to provide a high impedance at the output terminal. However, such prior art buffer circuits have the disadvantage in that they consume the same amount of power when in the tri-state mode as when the output terminal is at the low logic state.

It would therefore be desirable to provide a TTL tri-level buffer which draws less current during the tri-state mode so as to reduce power consumption. This is achieved by utilizing three phase splitters instead of a single phase splitter in conventional designs so that a smaller amount of current will be drawn through the tri-state control line during the tri-state mode.

SUMMARY OF THE INVENTION

Accordingly, it is a general object of the present invention to provide an improved tri-level buffer circuit which is relatively simple and economical to manufacture and assemble, but yet overcomes the disadvantage of the prior art buffer circuits.

It is an object of the present invention to provide a tri-level buffer which consumes less power in the tri-state mode than in the low logic state.

It is another object of the present invention to provide a tri-level buffer circuit which includes three phase splitter transistors so as to reduce the amount of current drawn during the tri-state mode of operation.

It is still another object of the present invention to provide a tri-level buffer circuit which includes a plural emitter bipolar transistor, three phase splitter bipolar transistors, a pull-up bipolar transistor, and a pull-down bipolar transistor.

In accordance with these aims and objectives, the present invention is concerned with the provision of a tri-level buffer circuit which includes a pull-up bipolar transistor and a pull-down bipolar transistor. The pull-up transistor has its collector coupled to a supply potential and its emitter coupled to an output terminal. The pull-down transistor has its collector connected to the emitter of the pull-up transistor and its emitter coupled to a ground potential. A plural emitter bipolar transistor has at least one emitter coupled to a logic input terminal and another emitter coupled to a tri-state input terminal. The base of the plural-emitter transistor is coupled to the supply potential via a first resistor. A first phase splitter bipolar transistor has its base coupled to the collector of the plural emitter transistor and its emitter coupled to the base of the pull-down transistor. A second phase splitter bipolar transistor has its base coupled to the collector of the plural emitter transistor, its collector coupled via a second resistor to the supply potential, and its emitter coupled to the base of the pull-down transistor. A third phase splitter bipolar transistor has its base coupled to the collector of the plural emitter transistor, its collector coupled to the base of the pull-up bipolar transistor and to the supply potential via a third resistor, and its emitter coupled to the base of the pull-down transistor. A current source is coupled between the supply potential and the collector of the first phase splitter transistor. An active turn off transistor has its base coupled to the collector of the second phase splitter transistor, its collector coupled to the base of the pull-down bipolar transistor via a fourth resistor and its emitter coupled to the emitter of the pull-down transistor. A diode is coupled between the collector of the first phase splitter transistor and the tri-state input terminal.

BRIEF DESCRIPTION OF THE DRAWING

These and other objects and advantages of the present invention will become more fully apparent from the following detail description when read in conjunction with the accompanying drawing in which there is shown a schematic circuit diagram of the buffer circuit of the instant invention.

DESCRIPTION OF THE PREFERRED EMBODIMENT

Referring now in detail to the drawing of the particular illustration, there is shown a schematic circuit diagram of a transistor-transistor logic (TTL) tri-level buffer circuit 10 of the present invention which includes a first logic input terminal 12, a second logic input terminal 14, a tri-state input terminal 16, and an output terminal 18. The tri-state input terminal 16 receives a control signal which is normally in a high logic level. The control signal is switched to a low logic level during a tri-state mode of operation so as to present a high impedance at the output terminal 18. During normal conditions, the output terminal 18 will be at a high logic level if either of the input terminals 12 or 14 is at a low logic level. The output terminal 18 will be at a low logic level only when both of the input terminals 12 and 14 are at a high logic level. Thus, the buffer circuit 10 functions as a two-input NAND gate. While a plural emitter transistor Q9 is illustrated with three emitters for the inputs, it should be understood that each input could be achieved by utilizing a separate diode.

The buffer circuit 10 is comprised of a multi-emitter current steering transistor Q9, a first phase splitter transistor Q5, a second phase splitter transistor Q10, a third phase splitter transistor Q4, a pull-down transistor Q1 and an output-stage section 21. The current steering transistor Q9 has a first emitter coupled to the first input terminal 12, a second emitter coupled to the second input terminal 14, and a third emitter coupled to the tri-state input terminal 16. The base of the current steering transistor Q9 is connected to a supply voltage or potential VCC via a resistor R8. The supply potential VCC is typically +5.0 volts. The collector of the transistor Q9 is connected to the base of the first phase splitter transistor Q5, the base of the second phase splitter transistor Q10 via a resistor R10, and the base of the third phase splitter transistor Q4.

The first phase splitter transistor Q5 has its collector connected via a temperature-controlled current source 20 to the supply potential and its emitter connected to the base of the pull-down transistor Q1. The temperature-controlled current source 20 is formed of a pair of bipolar transistors Q6, Q7 and a pair of resistors R6 and R7. The bipolar transistor Q6 has its base connected to the emitter of the bipolar transistor Q7 and to one end of the resistor R6. The collector of the transistor Q6 is connected to the base of the transistor Q7 and to one end of the resistor R7. The other end of the resistor R7 is connected to the supply potential VCC. The collector of the transistor Q7 is also connected to the supply potential. The emitter of the transistor Q6 is connected to the other end of the resistor R6 and to the collector of the first phase splitter transistor Q5. The temperature-controlled current source 20 is designed so as to provide a greater amount of current at the low temperature of $-55°$ C. and a smaller amount of of current at the high temperature of $+155°$ C. Since the beta (current gain) of the transistor Q1 will increase with temperature, a smaller current drive is required at the higher temperatures.

The second phase splitter transistor Q10 has its base connected to the resistor R10, its collector connected to the supply potential VCC via a load resistor R9, and its emitter connected to the base of the pull-down bipolar transistor Q1. An active turn-off circuit 22 is connected between the collector and emitter of the transistor Q10. The active turn-off circuit includes a bipolar transistor Q8, a Schottky diode D2 and resistors R5, R11. The base of the transistor Q8 is connected to the cathode of the Schottky diode D2 and to one end of the resistor R5. The anode of the diode D2 is connected to the junction of the collector of the transistor Q10 and the resistor R9. The collector of the transistor Q8 is connected to one end of the resistor R11, and the other end of the resistor R11 is connected to the base of the pull-down bipolar transistor Q1. The emitter of the transistor Q8 is connected to the other end of the resistor R5 and to a ground potential.

The third phase splitter transistor Q4 has its collector connected to one end of a resistor R4 and to the anode of a Schottky diode D5. The other end of the resistor R4 is connected to the supply potential VCC, and the anode of the diode D5 is connected via a tri-state control line 24 to the tri-state input terminal 16. The emitter of the transistor Q4 is connected to one end of a resistor R3, and the other end of the resistor R3 is connected to the ground potential.

The output-stage section 21 includes a pair of bipolar transistors Q2 and Q3 connected in a Darlington configuration. It should be understood that the Darlington pair could be replaced by a single transistor. The collectors of the transistors Q2 and Q3 are connected to one end of a resistor R2. The other end of the resistor R2 is connected to the supply potential VCC. The base of the transistor Q3 is connected to the junction of the resistor R4 and the collector of the transistor Q4. The emitter of the transistor Q3 is connected to the base of the transistor Q2 and to one end of a resistor R1. The other end of the resistor R1 is connected to the ground potential. The pull-down bipolar transistor Q1 has its base joined to the emitters of the transistors Q5, Q10 and Q4 and to one end of the resistor R3. The other end of the resistor R3 is connected to the ground potential. The collector of the transistor Q1 is connected to the emitter of the transistor Q2 and to the output terminal 18. The emitter of the transistor Q1 is connected to the ground potential. A Schottky diode D1 is connected between the base and emitter of the transistor Q3. A Schottky diode D3 is connected between the output terminal 18 and the ground potential.

The transistor Q2 defines a current source transistor and operates as a pull-up device. The transistor Q1 defines a current sink transistor and operates as a pull-down device. It will be noted that the transistors Q9, Q5, Q10, Q4, Q8, Q3, and Q1 are preferably Schottky transistors so as to avoid saturation, thereby permitting a higher switching speed of operation. The resistor R1 provides a discharge path from the base of the transistor Q2 so as to quickly turn off the same, thereby facilitating and speeding up the high-to-low transition at the output terminal 18. The transistor Q8 is used to quickly turn on the pull-down transistor Q1 during this high-to-low transition at the output terminal 18. It should be understood to those skilled in the art that the buffer circuit 10 may be formed on a single silicon chip of a monolithic integrated circuit. Further, it will be noted that all of the transistor are of the NPN-type conductivity.

Now, the operation of the buffer circuit 10 of this invention constructed as described above will be explained. During normal operating conditions, the control signal on the tri-state input terminal 16 will be at a high logic state. Assume that at least one of the input terminals 12 and 14 is at a low or "zero" logic state. This will cause the current steering transistor Q9 to be rendered conductive and will cause the phase splitter transistors Q5, Q10 and Q4 to be rendered non-conductive. Since the phase splitter transistor Q5 is turned off, the current source 20 will be unavailable to supply base drive current to the pull-down transistor Q1. Similar, there will be no base drive current from the phase splitter transistors Q10 and Q4 since they also are both turned off. Thus, the pull-down bipolar transistor Q1 will be turned off. With the second phase splitter transistor Q10 being turned off, the collector will be at a high potential which is fed to the base of the transistor Q8 via the diode D2. As a result, the transistor Q8 will be rendered conductive so as to maintain the base of the pull-down transistor Q1 at a low potential, thereby ensuring that the transistor Q1 will be turned off. With the third phase splitter transistor Q4 being turned off, the collector will be at a high potential which is fed to the base of the transistor Q3 so as to turn on the same. This will cause the pull-up transistor Q2 to be rendered conductive. As a result, the output terminal will be pulled up to a high output level $V_{OH}$ which is equal to $VCC-2V_{BE}$ via the transistor Q2, the transistor Q3 and the resistor R4.

When both of the input terminals 12 and 14 are switched to a high or "one" logic state, this causes the current steering transistor Q9 to be rendered non-conductive and will cause the phase splitter transistor Q5, Q10 and Q4 to be rendered conductive. Since the phase splitter transistor Q5 is turned on, the current source 20 will be supplied to the base of the pull-down transistor Q1. Also, there will be base drive current supplied from the phase splitter transistors Q10 and Q4 since they are both turned on. Thus, the pull-down transistor Q1 will be turned on. However, most of the current to the base of the transistor Q1 will be from the current source 20. With the second phase splitter transistor Q10 being rendered conductive, the current flowing in the resistor R9 will be diverted from the base of the transistor Q8 so that the transistor Q8 will be turned off thereby causing the current to flow into the base of the transistor Q1. With the third phase splitter transistor Q4 being rendered conductive, the current flowing in the resistor R4 will be drawn away from the base of the transistor Q3 so as to turn off the same. This will cause the transistor Q2 to be rendered non-conductive. As the consequence, the output terminal 18 will be pulled down to a low output level $V_{OL}$ which is near the ground potential via the transistor Q1.

For a tri-state mode of operation, the control signal will be in the active state as a low logic level which is applied to the tri-state terminal 16. As a result, the buffer circuit 10 will produce a relatively high impedance at the output terminal 18 since both the transistors Q1 and Q2 will be turned off. As can be seen, when the tri-state terminal 16 is in the low logic state, the current steering transistor Q9 will be maintained in the turned on condition and the phase splitter transistor Q5, Q10 and Q4 will be in the turn off condition regardless of the input signals applied to the input terminals 12 and 14. The current flowing through the resistor R4 will now be sent through the Schottky D5 and the tri-state control line 24 to the tri-state terminal 16. Since the first phase splitter transistor Q5 is rendered non-conductive, the current from the current source 20 is saved which reduces power consumption during this tri-state mode. Since the resistance value of the resistor R4 determines the amount of current flowing in the tri-state control line, this value should be made as high as possible so as to minimize power consumption. However, the resistor R4 must be small enough so as to supply adequate base drive current to the transistor Q3 when the output terminal 18 is at the high output level $V_{OH}$ under the normal operating conditions.

The buffer circuit 10 of the present invention was built substantially as illustrated using standard silicon IC processing and was found to provide a high quality performance. The following resistance values were used:

| RESISTOR | VALUE |
| --- | --- |
| R1 | 8 kOhms |
| R2 | 40 Ohms |
| R3 | 4 kOhms |
| R4 | 4.5 kOhms |
| R5 | 5.1 kOhms |
| R6 | 532 Ohms |
| R7 | 4.4 kOhms |
| R8 | 6 kOhms |
| R9 | 9 kOhms |
| R10 | 200 Ohms |
| R11 | 100 Ohms |

From the foregoing detailed description, it can thus be seen that the present invention provides an improved tri-level buffer which consumes less power in the tri-state mode than in the low logic state. The tri-level buffer of the instant invention includes three phase splitter transistors so as to reduce the amount of current that will be drawn through the tri-state control line during the tri-state mode.

While there has been illustrated and described what is at present to be considered a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the true scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A tri-level buffer circuit comprising:

a pull-up bipolar transistor having its collector coupled to a supply potential and its emitter coupled to an output terminal;

a pull-down bipolar transistor having its collector coupled to the emitter of said pull-up bipolar transistor and its emitter coupled to a ground potential;

a plural emitter bipolar transistor having at least one emitter coupled to a logic input terminal and another emitter coupled to a tri-state input terminal, the base of said plural emitter transistor being coupled to the supply potential via a first resistor;

a first phase splitter bipolar transistor having its base coupled to the collector of said plural emitter transistor and its emitter coupled to the base of said pull-down bipolar transistor;

a second phase splitter bipolar transistor having its base coupled to the collector of said plural emitter transistor, its collector coupled via a second resistor to the supply potential, and its emitter coupled to the base of said pull-down bipolar transistor;

a third phase splitter bipolar transistor havings its base coupled to the collector of said plural emitter transistor, its collector coupled to the base of said pull-up bipolar transistor and to the supply potential via a third resistor, and its emitter coupled to the base of said pull-down bipolar transistor;

current source means coupled between the supply potential and the collector of said first phase splitter bipolar transistor;

an active turn-off transistor having its base coupled to the collector of said second phase splitter transistor, its collector coupled to the base of said pull-down bipolar transistor, and its emitter coupled to the emitter of said pull-down bipolar transistor; and diode means coupled between the collector the said first phase splitter transistor and said tri-state input terminal.

2. A buffer circuit as claimed in claim 1, wherein said pull-down bipolar transistor comprises a Schottky transistor.

3. A buffer circuit as claimed in claim 1, wherein said pull-down bipolar transistor is of a NPN-type conductivity.

4. A buffer circuit as claimed in claim 1, wherein said pull-up bipolar transistor is of a NPN-type conductivity.

5. A buffer circuit as claimed in claim 1, wherein said first, second, and third phase splitter bipolar transistor comprises Schottky transistors.

6. A buffer circuit as claimed in claim 1, wherein said first, second, and third phase splitter bipolar transistors are of a NPN-type conductivity.

7. A buffer circuit as claimed in claim 1, wherein said current source means comprises a temperature-controlled current source which supplies a greater amount of current at a low temperature and which supplies a smaller amount of current at a high temperature.

8. A buffer circuit as claimed in claim 7, wherein said temperature-controlled current source is formed of a pair of transistors and a pair of resistors.

9. A buffer circuit as claimed in claim 1, wherein said diode means comprises a Schottky diode which has its anode connected to the collector of said first phase splitter transistor and its cathode connected to the tri-state input terminal.

10. A buffer circuit as claimed in claim 1, wherein said tri level buffer circuit is formed on a single silicon chip of an integrated circuit.

11. In a tri-level buffer circuit including a pull-up bipolar transistor and a pull-down bipolar transistor, the pull-up transistor having its collector coupled to a supply potential and its emitter coupled to an output terminal, the pull-down bipolar transistor havings its collector coupled to the emitter of the pull-up bipolar transistor and its emitter coupled to a ground potential, wherein the improvement comprises:

a plural emitter bipolar transistor having at least one emitter coupled to a logic input terminal and another emitter coupled to a tri-state input terminal, the base of said plural emitter transistor being coupled to the supply potential via a first resistor;

a first phase splitter bipolar transistor havings its base coupled to the collector of said plural emitter transistor and its emitter coupled to the base of said pull-down bipolar transistor;

a second phase splitter bipolar transistor having its base coupled to the collector of said plural emitter transistor, its collector coupled via a second resistor to the supply potential, and its emitter coupled to the base of said pull-down bipolar transistor;

a third phase splitter bipolar transistor having its base coupled to the collector of said plural emitter transistor, its collector coupled to the base of said pull-up bipolar transistor and to the supply potential via a third resistor, and its emitter coupled to the base of said pull-down bipolar transistor;

current source means coupled between the supply potential and the collector of said first phase splitter bipolar transistor;

an active turn-off transistor having its base coupled to the collector of said second phase splitter transistor, its collector coupled to the base of said pull-down bipolar transistor, and its emitter coupled to the emitter of said pull-down bipolar transistor; and diode means coupled between the collector the said first phase splitter transistor and said tri-state input terminal.

12. In a buffer circuit as claimed in claim 11, wherein said pull-down bipolar transistor comprises a Schottky transistor.

13. In a buffer circuit as claimed in claim 11, wherein said pull-down bipolar transistor is of a NPN-type conductivity.

14. In a buffer circuit as claimed in claim 11, wherein said pull-up bipolar transistor is of a NPN-type conductivity.

15. In a buffer circuit as claimed in claim 11, wherein said first, second, and third phase splitter bipolar transistor comprises Schottky transistors.

16. In a buffer circuit as claimed in claim 11, wherein said first, second, and third phase splitter bipolar transistors are of a NPN-type conductivity.

17. In a buffer circuit as claimed in claim 11, wherein said current source means comprises a temperature-controlled current source which supplies a greater amount of current at a low temperature and which supplies a smaller amount of current at a high temperature.

18. In a buffer circuit as claimed in claim 17, wherein said temperature-controlled current source is formed of a pair of transistors and a pair of resistors.

19. In a buffer circuit as claimed in claim 11, wherein said diode means comprises a Schottky diode which has its anode connected to the collector of said first phase splitter transistor and its cathode connected to the tri-state input terminal.

20. In a buffer circuit as claimed in claim 11, wherein said buffer circuit is formed on a single silicon chip of an integrated circuit.

* * * * *